(12) United States Patent  
Loftus

(10) Patent No.: US 7,361,032 B2
(45) Date of Patent: Apr. 22, 2008

(54) MECHANICAL SPRING COMPONENT FOR USE IN MEMORY DEVICE

(75) Inventor: John Loftus, Laguna Beach, CA (US)

(73) Assignee: Imation Corp., Oakdale, MN (US)

( * ) Notice: Subject to any disclaimer, the term of this patent is extended or adjusted under 35 U.S.C. 154(b) by 0 days.

(21) Appl. No.: 11/373,482

(22) Filed: Mar. 10, 2006

(65) Prior Publication Data

US 2007/0015407 A1  Jan. 18, 2007

(51) Int. Cl.
*H01R 13/44* (2006.01)
(52) U.S. Cl. .................................. 439/131
(58) Field of Classification Search ............ 439/131, 439/130, 172
See application file for complete search history.

(56) References Cited

U.S. PATENT DOCUMENTS

| | | | |
|---|---|---|---|
| 5,432,510 A | 7/1995 | Matthews | |
| 6,189,788 B1 | 2/2001 | Sherman et al. | |
| D463,426 S | 9/2002 | Cheng | |
| 6,490,163 B1 * | 12/2002 | Pua et al. ................... | 361/737 |
| 6,561,421 B1 | 5/2003 | Yu | |
| D475,359 S | 6/2003 | Hirose | |
| 6,612,853 B2 | 9/2003 | Wu | |
| 6,633,483 B2 | 10/2003 | Akagi et al. | |
| 6,650,534 B2 | 11/2003 | Tree | |
| 6,671,808 B1 | 12/2003 | Abbott et al. | |
| 6,676,419 B1 * | 1/2004 | Lin et al. ................... | 439/76.1 |
| D489,053 S | 4/2004 | Nakamura | |
| 6,724,618 B1 | 4/2004 | Jenkins et al. | |
| D490,814 S | 6/2004 | Kim | |
| 6,758,688 B2 | 7/2004 | Chen | |
| 6,763,410 B2 | 7/2004 | Yu | |
| D493,790 S | 8/2004 | Wu | |
| 6,778,401 B1 | 8/2004 | Yu et al. | |
| 6,792,487 B2 | 9/2004 | Kao | |
| 6,813,662 B2 | 11/2004 | Park | |
| 6,979,210 B2 * | 12/2005 | Regen et al. ............... | 439/131 |
| 7,009,847 B1 * | 3/2006 | Wu et al. ................... | 361/737 |
| 7,037,120 B1 * | 5/2006 | Yeh .......................... | 439/131 |
| 7,090,515 B2 * | 8/2006 | Regen et al. ............... | 439/131 |

* cited by examiner

*Primary Examiner*—Phuong Dinh
(74) *Attorney, Agent, or Firm*—Eric D. Levinson

(57) ABSTRACT

Methods and apparatus are provided for an improved portable memory device. In one embodiment, a portable memory device is provided comprising a housing having a proximal opening and a distal opening. A slidable unit may be at least partially mounted in the housing. The slidable unit may comprise of a memory device slidably mounted in the housing, wherein the memory device has a data connector mounted on one end and a push button on the other end. A resilient member may be coupled to the slidable unit. Moving the slidable unit from a first position to a second position will simultaneously extend the data connector from the housing while also loading the resilient member to urge the data connector back into the housing. The portable memory device may include a latch coupled to the housing for holding the slidable unit in the second position. In the present embodiment, a user may press a release button so that the latch will allow the connector to be automatically drawn back into the housing.

16 Claims, 6 Drawing Sheets

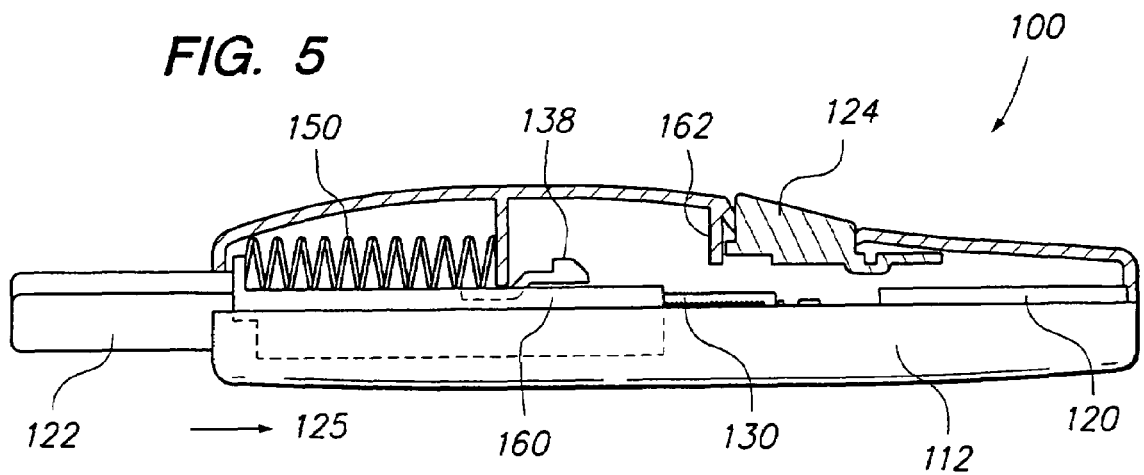
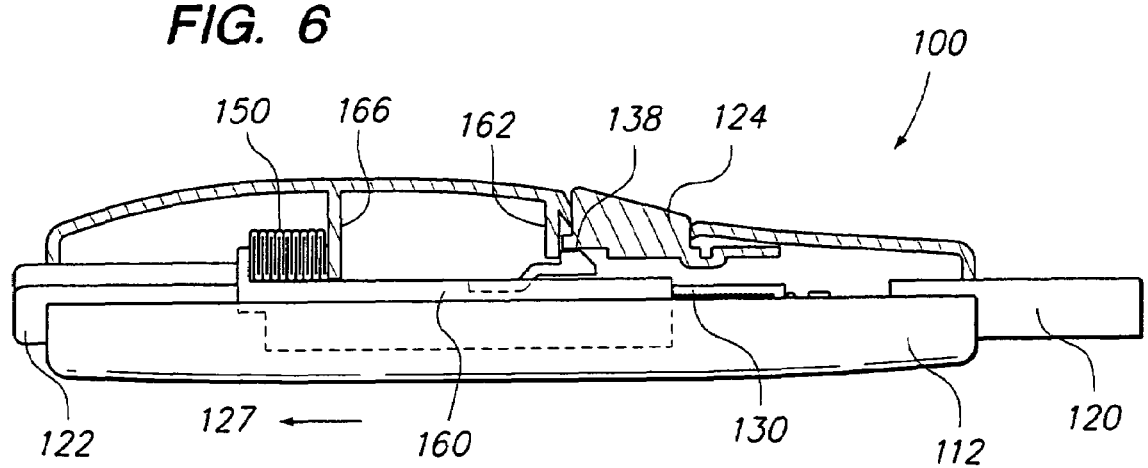

US 7,361,032 B2

MECHANICAL SPRING COMPONENT FOR USE IN MEMORY DEVICE

BACKGROUND OF THE INVENTION

1. Field of the Invention

This invention relates to computer memory devices and more specifically, mechanical components for use with computer memory devices.

2. Description of Related Art

Today's computer memory devices are becoming more compact while providing even more storage capacity. This trend has grown to encompass all types of personal computing devices and computer memory devices, including but not limited to portable computer memory peripherals such as universal serial bus (USB) drives. Some embodiments of these drives are now capable of holding gigabytes of information in a relatively small form factor. These USB drives are compact, rewritable, and can quickly transfer large files between devices with a USB port. This has allowed a great degree of flexibility in business environments where users in a meeting or other setting can easily transfer files between various computing devices.

Due to their convenient size, these portable computer memory peripherals are typically carried in user pockets, accessory pouches in computer carrying cases, briefcases, or the like. These storage or transport environments, however, often fail to provide the optimal conditions for a computer memory device. For example, a user's pocket may contain contaminants such as lint or other debris from everyday wear. The user may also create physical stress on the device by sitting or moving with the device in the pocket. The electrical contacts of the portable memory device may be subject to damage. Some known devices use caps or covers to protect these electrical contacts. These caps and covers, however, are typically separate devices that may be lost or misplaced, leaving the electrical contacts unprotected. Loss of these device may subject the portable memory device to damage and loss of information. The use of caps and covers also inconveniences a user, bring in more parts into play. Caps and covers often require two-handed operation, requiring one to pull the cap off while the other holds the device.

SUMMARY OF THE INVENTION

Accordingly, one object of the present invention is to provide improved designs for portable computer memory devices.

Another object of the present invention is to improve the convenience for users to protect data connectors and other sensitive parts on a portable computer memory device.

Another object of the present invention is to create a user friendly design that is intuitive for the user to operate.

Another object of the present invention is to create memory device that allows for one hand operation to extend and retract the data connector.

At least some of these objects are achieved by some embodiments of the present invention.

In one embodiment according to the present invention, a device is provided having 1) a spring mechanism used to retract a USB connector, wherein 2) pushing the USB slider out, also cocks spring and latches the entire slidable unit to a release button. This entire unit may include the push button and the latch. There may be a release button on top of housing, wherein pressing the release button automatically draws the USB connector back into the housing. The user presses on proximal end to extend the distal end and also load a spring or other device to urge the connector back into the housing when a release button is pressed. The extension of the data connector and the loading of the spring may occur simultaneously. The entire unit with the push button on one end and the USB connector on the other, may extend through the housing. In the present embodiment, the device is designed to simultaneously load the return spring when the data connector is extended.

A further understanding of the nature and advantages of the invention will become apparent by reference to the remaining portions of the specification and drawings.

BRIEF DESCRIPTION OF THE DRAWINGS

FIGS. 5 and 6 show partial cross-sectional view of yet another embodiment of the present invention.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for having a light indicator, this means that the light indicator feature may or may not be present, and, thus, the description includes structures wherein a device possesses the light indicator feature and structures wherein the light indicator feature is not present.

Figure 1:
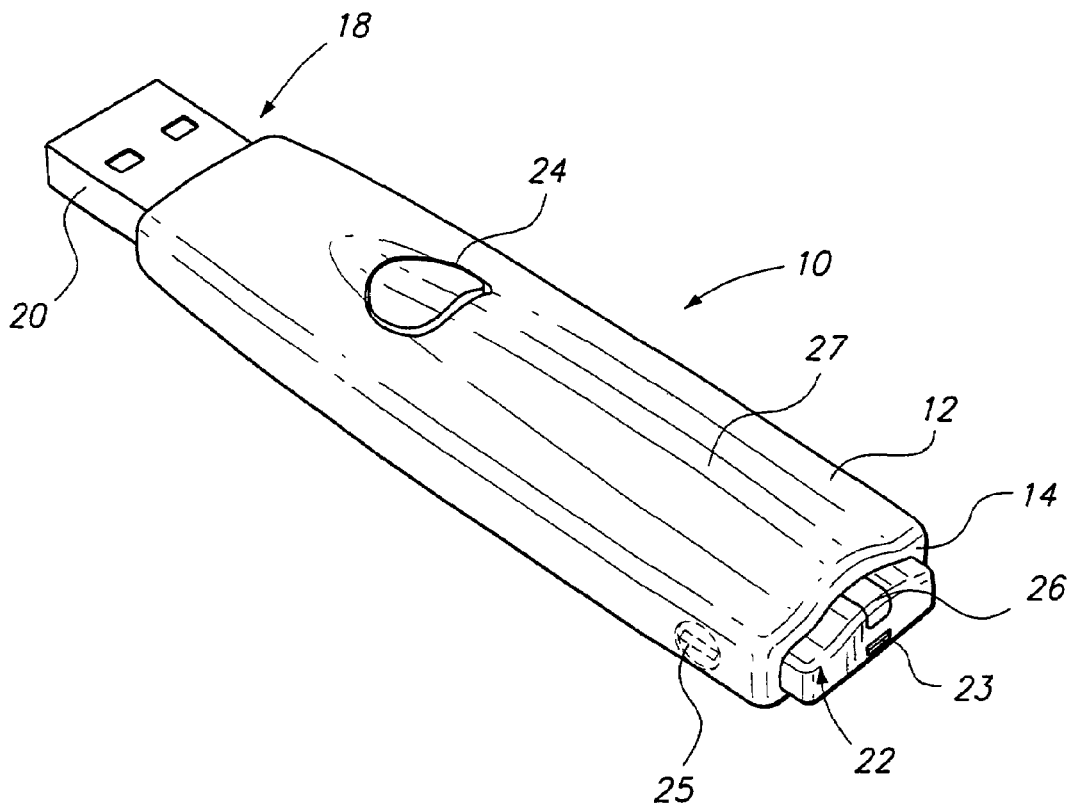
FIG. 1 shows a perspective view of one embodiment according to the present invention.
Figure 2:
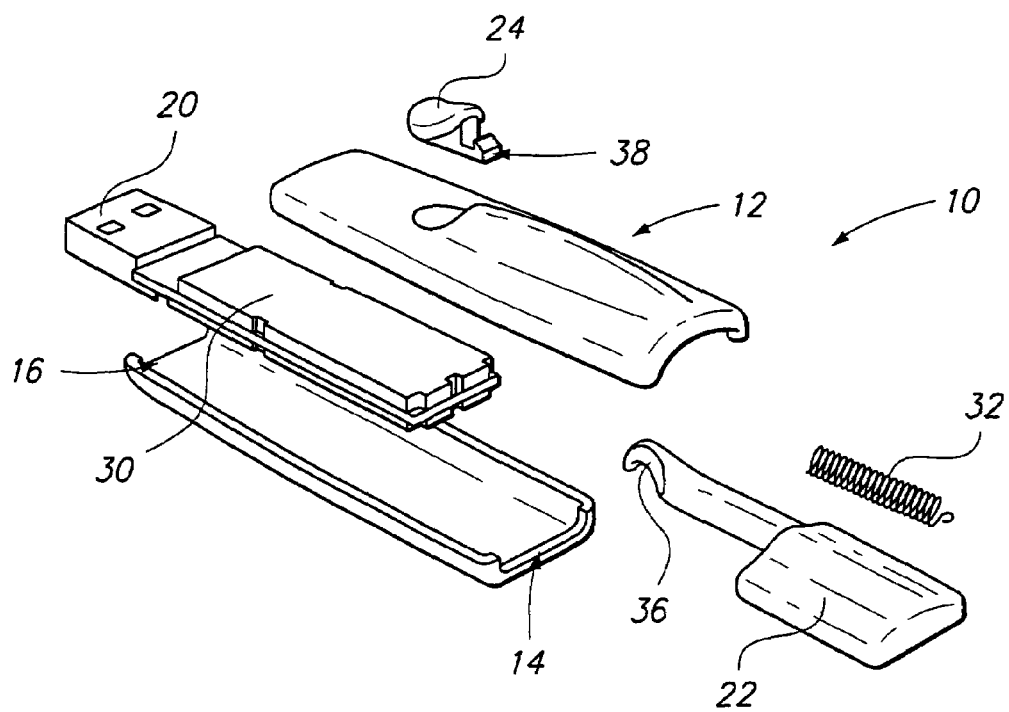
FIG. 2 shows an exploded perspective view of one embodiment according to the present invention.

Referring now to FIG. 1, one embodiment of a portable memory device 10 according to the present invention will now be described. FIG. 1 shows a perspective view of a device 10 having a housing 12. As seen in FIG. 2, it should be understood that the housing may be one integrated piece, two separate pieces placed together, or multiple pieces attached together. The housing 12 has one opening 14 at its proximal end and a second opening (see FIG. 2) at its distal end 18. FIG. 1 shows the portable memory device 10 in a configuration where the USB electrical connector 20 is extended and ready for connection to a USB port. In a travel or non-use configuration, the USB electrical connector 20 will be retracted into the housing 12 for protection of the connector 20. As will be described in further detail below, the user may press on the button end 22 to extend the USB electrical connector 20 for use, similar to pressing on a button to extend the ball point end on a pen. When the user is done using the storage device, in this embodiment, the USB electrical connector 20 is retracted into the housing 12 by pressing on release button 24. Optionally, the button end 22 may include an indicator light 26 to show if there is activity with the memory device. In the present embodiment, the light 26 may be a light pipe, fiber optic, or light conduit for carrying light from a source to be displayed on the button end 22. It should be understood that in one embodiment, the power for the light may be drawn from the computer through the USB port. The device 10 may also include a lanyard attachment 23 on the rear portion of the device 10 such as, but not limited to being on button 22. In some embodiments, the lanyard attachment 25 may be on the housing 12 as indicated in phantom. It may also be on the underside or front of the housing 12. FIG. 1 also shows that the housing 12 may have a raised center portion 27 that runs longitudinally along the housing 12 to accommodate the internal components such as but not limited to the spring 50 (FIG. 4).

FIG. 2 shows an exploded perspective view of the device of FIG. 1. As seen in this embodiment, the device 10 has a housing 12 formed from an upper housing and a lower housing. This housing 12 defines the openings 14 and 16. The USB electrical connector 20 and the attached computer memory 30 are slidably mounted in the housing 12. By way of example and not limitation, the computer memory 30 may be a flash RAM module. In the present embodiment, a spring 32 is used to retract the USB electrical connector 20 and the attached computer memory 30 into the housing. The push button 22 is shown as a separate piece. In most embodiments, the push button 22 will be connected or attached to the computer memory 30 so that it can be contacted by the user to extend the memory 30 and USB electrical connector 20. In this present embodiment, the push button 22 includes a latch or hook 36 for mating with a hook 38 on the release button 24. The spring 32 will have one end attached to the push button 22 or some portion of the slidable computer memory 30 and another end attached to the housing 12. Pressing the push button 24 will extend the USB electrical connector 20.

Figure 3:
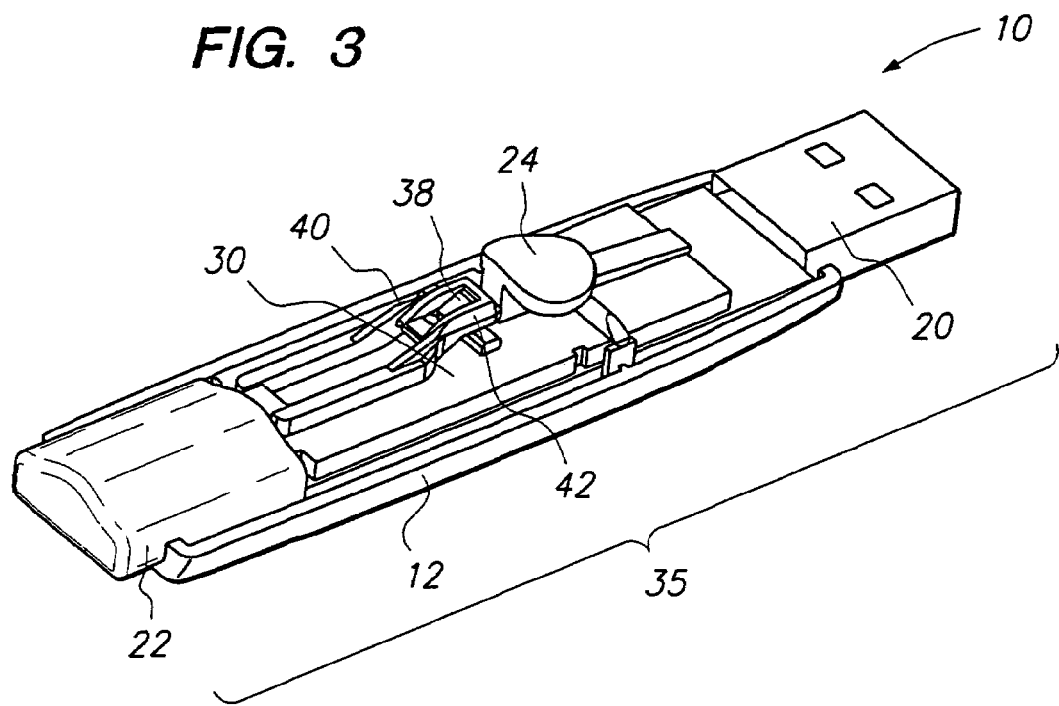
FIG. 3 shows a view of the internal components of another embodiment of the present invention.

Referring now to FIG. 3, a still further embodiment of a portable memory device 10 is shown. FIG. 3 shows a perspective view of the portable memory device 10 with the top portion of housing 12 removed. FIG. 3 shows another embodiment of a latch 40 that is different in shape than the one shown in FIG. 2. Latch 40 in FIG. 3 allows a hook 38 to engage the latch 40 and hold the computer memory 30 in position, with the USB electrical connector 20 extended. When the button 24 is pushed, the hook 38 will be moved to disengage from latch 40 and allow the computer memory 30 to slide and retract the USB electrical connector 20 into the housing 12. The latch 40 is structured to have an aperture or hook engagement area 42 to contact the hook 38. In the present embodiment, a protrusion 44 is provided with the latch 40 (see FIG. 4). This protrusion 44 provides an anchor point for a spring used to retract the USB electrical connector 20. As seen in FIG. 3, except for the button 24, the unit 35 formed by the button 22, the computer memory 30, hook 38, and the USB electrical connector move together as substantially one integral unit 35, relative to the housing 12. In this embodiment, this allows force applied to the button 22 to slide the entire unit 35 and extend the USB electrical connector 20 from the housing 12. When the release button 24 is pressed, the USB electrical connector 20 will slide with the unit 35 and be retracted into the housing 12. It should be understood that the slidable unit 35 may be one integral piece, two separate pieces placed together, or multiple pieces attached together.

Figure 4:
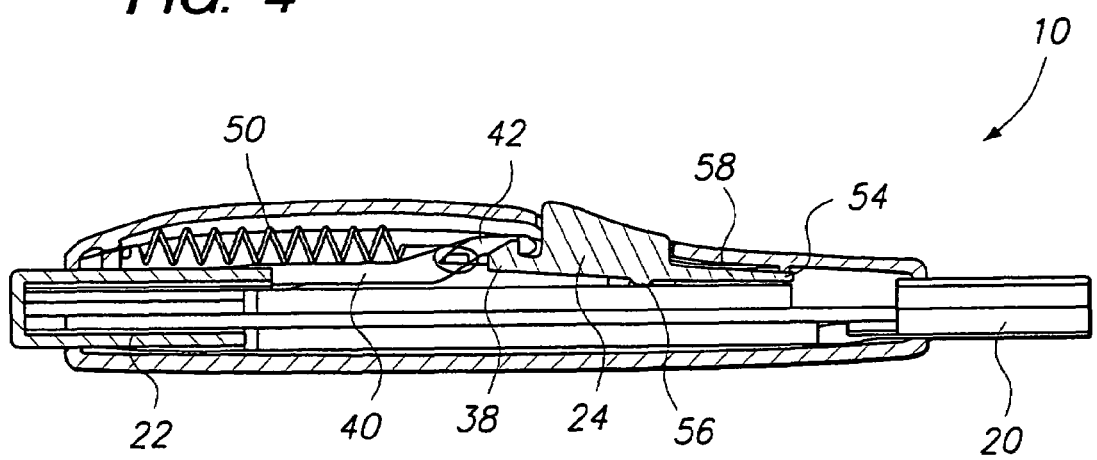
FIG. 4 is cross-section of the embodiment of FIG. 3.

FIG. 4 shows a cross-sectional view of the device of FIG. 3. FIG. 4 shows the spring 50 in a stretched configuration. The spring 50 is stretched when the push button 22 is pushed by the user to extend the USB electrical connector 20. Pushing on button 22 will slide the computer memory 30 and extend the USB electrical connector 20 outward from the housing 12. The hook 38 will engage the latch 40 to keep the spring 50 (now extended) from pulling the USB connector 20 back into the housing 12. For this particular embodiment, the spring 50 is coupled on one end to the housing 12 via a protrusion 52. This provides a fixed point of attachment of the spring 50 to the housing 12. On the other end, the spring 50 is attached to the protrusion 44 on the latch 40. Latch 40 slides with the computer memory 30 and provides return force to bring the USB connector 40 and the computer memory 30 back into the housing 12. FIG. 4 shows that the release button 24, when pushed, will move the hook 38 to disengage from a surface on the latch 40, allowing the spring 50 to then retract the computer memory 30 and USB electrical connector 20 into the housing 12. This particular embodiment of the release button 24 may be cantilevered, with one end 54 against the housing 12 and pivoting about a pivot point 56. The elongate portion 58 provides spring force to return the release button 24 to its original position after the button is pressed.

Referring now to FIG. 5, a partial cross-sectional view of yet another embodiment of the present invention will now be described. FIG. 5 shows another portable memory device 100 with a housing 112. FIG. 5 shows the USB electrical connector 120 in a first or retracted position inside the housing 112. The button 122 is shown in an extended configuration, ready to be pressed in the direction indicated by arrow 125 to extend the USB electrical connector 120. A spring 150 is positioned in the device 100 to provide return force to bring the USB electrical connector 120 back into the housing 112. In this embodiment, a hook 138 is positioned to be on the bracket 160 mounted about the computer memory 130. The hook 138 will move with the USB electrical connector 120 when the button 122 is pushed in the direction indicated by arrow 125. In the present embodiment, the hook 138 is mounted on a cantilevered portion of the bracket 160, allowing the hook 138 to be depressed to slide underneath a protrusion 162 on the housing. It should be understood that the spring 150 in FIG. 5 is not in a compressed configuration.

Figure 9:
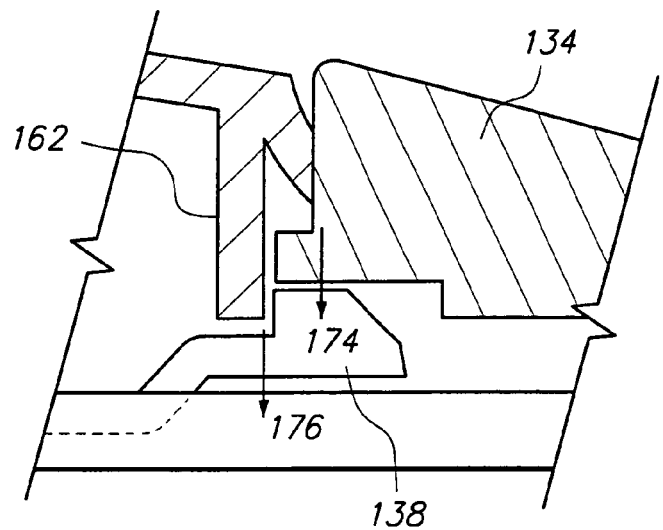
FIG. 9 shows a close-up view of one type of latching mechanism for use with the present invention.

Referring now to FIG. 6, another partial cross-sectional view of the embodiment of FIG. 5 is shown. FIG. 6 shows the device with the button 122 pressed and the USB electrical connector 120 in the extended configuration. The entire unit (the memory, the USB connector, and push button) is now in a second or extended position. The device 100 shown in FIG. 6 is ready to be docked to a USB port on receiving device. The spring 150 in FIG. 6 is shown in a compressed configuration. The spring 150 presses against a stop 166 on the housing 112. The spring 150 is thus compressed and desires to move the push button 122, the computer memory 130, and the USB electrical connector 120 in the direction indicated by arrow 127, back into the configuration shown in FIG. 25. In FIG. 6, the hook 138 is latched to protrusion 162, which prevents the USB electrical connector 120 from being retracted into the housing 112 by the spring 150. FIG. 9 shows the contact between the hook 138 and protrusion 162 in more detail. The hook 138 is mounted on a cantilevered beam portion on bracket 160. As shown in more clearly in FIG. 9, when the release button 134 is pressed, the hook 138 on the cantilevered beam portion will be deflected and disengage from the protrusion 162, allowing the spring 150 to retract the USB electrical connector 120. In one embodiment, the USB connector may be completely inside the housing when retracted. Other embodiments may have the USB connector substantially withdrawn when the device is in a non-use or storage configuration.

Figure 7:
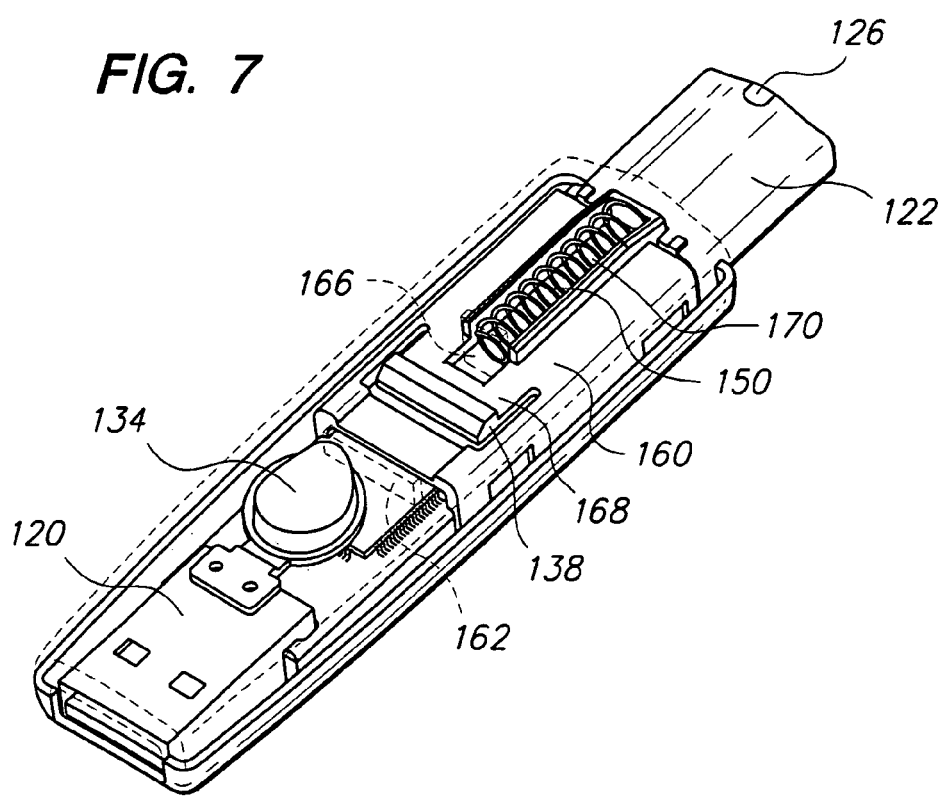
FIGS. 7 and 8 show the internal components of the embodiment shown in FIGS. 5 and 6.

Referring now to FIG. 7, a partial perspective view of the device of FIG. 5 will be described in further detail. The upper portion of housing 112 is shown in phantom in FIG. 12. Showing the upper portion of housing 112 in phantom allows for the interior components of the device 100 to be more clearly viewed. As seen in FIG. 7, the spring 150 is in a relaxed state. The USB electrical connector 120 is inside the housing 112 and is protected by the housing. The bracket 160 in FIG. 7 is positioned to more clearly show the hook 138 and how it is positioned on a cantilevered portion 168 of the bracket 160. This allows the hook 138 to be depressed so that it can slide underneath the protrusion 162 during extension of the USB electrical connector 120 or to allow the button 134 to press down on the hook 138 and allow for release and return of the USB electrical connector 120 into the housing 112. In this current embodiment, the spring 150 is confined in a cavity 170 formed on the upper surface of the bracket 160. This provides an attachment point of spring 150 to the housing 112 and confines the spring 150 to compress linearly when the button 122 is pressed (see FIG. 8). By way of example and not limitation, the bracket 160 may be attached to sit over the computer memory 130 or be otherwise coupled to move with the memory 130 and the USB electrical connector 120. Optionally, the button end 122 may include an indicator light 126 to show if there is activity with the memory device. In the present embodiment, the light 126 may be a light pipe, fiber optic, or light conduit for carrying light from a source to be displayed on the button end 122.

Figure 8:
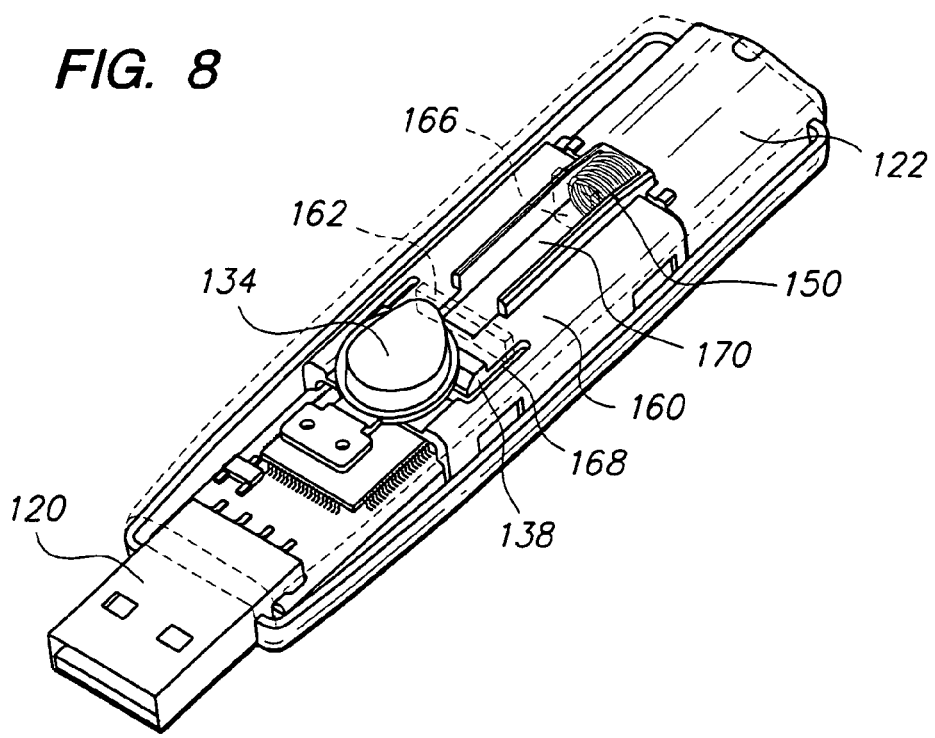

FIG. 8 shows the device 100 of FIG. 6 with the USB electrical connector 120 extended and the spring 150 compressed. FIG. 8 shows that the spring 150 is compressed and remains inside the cavity 170. The hook 138 slid under protrusion 162 and now engages an holding surface on the protrusion 162 to hold the computer memory 130 and USB electrical connector 120 in place, against the withdrawing force of the spring 150. Although a variety of spring configurations may be used, it should be understood the pressing the button 122 will cause a spring, a resilient member, or other device in the portable device 100 to be placed in a condition where the spring, resilient member, or other device desires to return the button 122 to its original position. In FIG. 4, the embodiment in that figure has a spring 50 that is extended and tensioned. The spring 50 wants to pull the USB electrical connector 20 back into the housing 12. In FIG. 8, the embodiment in that figure has a spring 150 that is compressed and desires to push on the button 122 and bring the USB electrical connector 120 back into the housing 112. Both embodiments (FIGS. 4 and 8) have springs that will exert force to bring the USB electrical connector back into the housing.

Referring now to FIG. 9, details of how the hook 138 disengages from the protrusion 162 is shown. The button 134 may be pressed downward as indicated by arrow 174. The downward movement of button 134 will in turn push the hook 138 downward as indicated by arrow 176. This disengages the hook 138 from the holding surface of protrusion 162, causing the spring 150 to bring the USB electrical connector 120 back into the housing 112.

Figure 10:
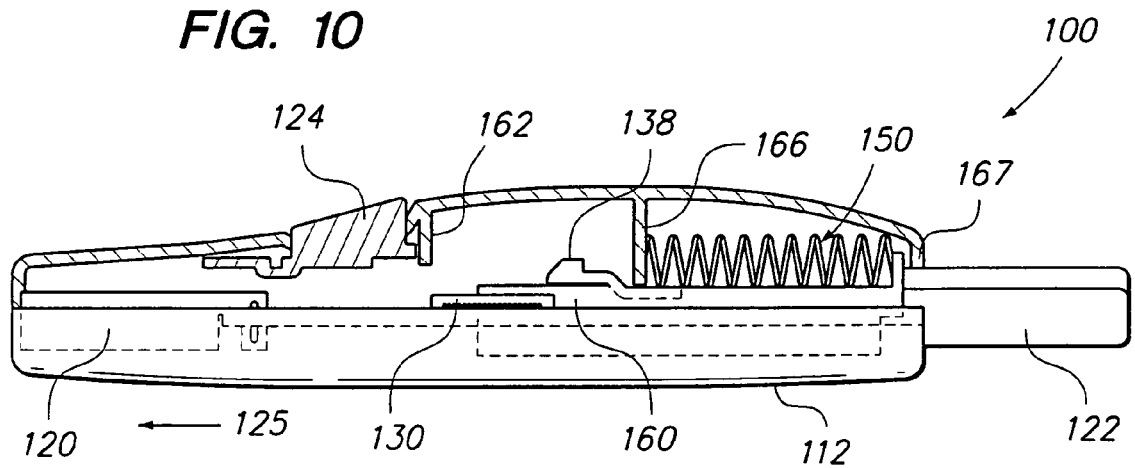
FIGS. 10 and 11 show cross-sectional view of one embodiment of the present invention.

FIG. 10 a full cross-sectional view of the present invention will now be described. FIG. 10 shows another portable memory device 100 with a housing 112. FIG. 10 shows the USB electrical connector 120 in a first or retracted position inside the housing 112. The button 122 is shown in an extended configuration, ready to be pressed in the direction indicated by arrow 125 to extend the USB electrical connector 120. A spring 150 is positioned in the device 100 to provide return force to bring the USB electrical connector 120 back into the housing 112. In this embodiment, a hook or engagement portion 138 is positioned on the bracket 160 coupled to move with the computer memory 130. The hook 138 will move with the USB electrical connector 120 when the button 122 is pushed in the direction indicated by arrow 125. In the present embodiment, the hook 138 is mounted on a cantilevered portion of the bracket 160, allowing the hook 138 to be depressed to slide underneath a protrusion 162. It should be understood that the spring 150 in FIG. 10 is not in a compressed configuration.

Figure 11:
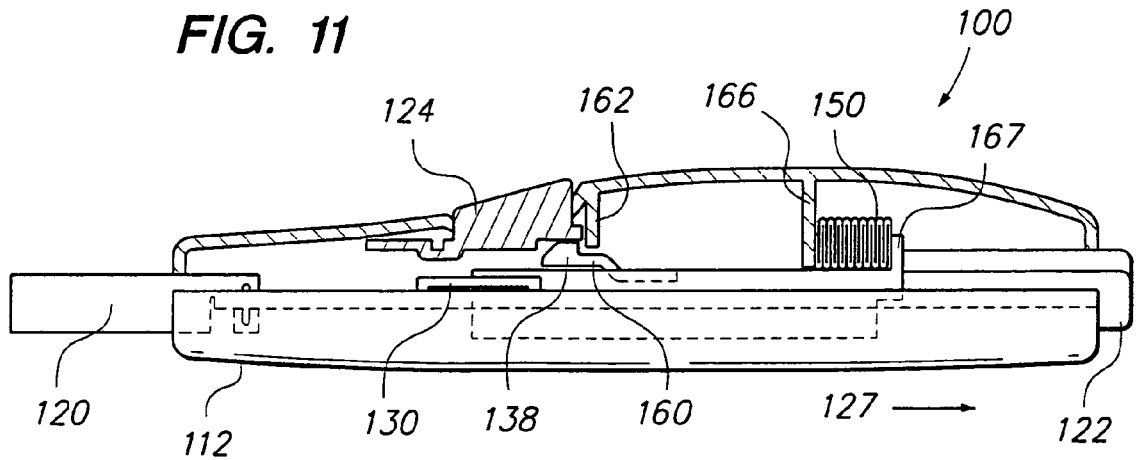

Referring now to FIG. 11, a cross-sectional view of the embodiment of FIG. 10 is shown with the connector 120 extended outward. FIG. 11 shows the device with the button 122 pressed and the USB electrical connector 120 in the extended configuration. The entire unit (the memory, the USB connector, and push button) is now in a second or extended position. The device 100 shown in FIG. 11 is ready to be docked to a USB port on receiving device. The spring 150 in FIG. 11 is shown in a compressed configuration. The spring 150 is compressed between stop 166 and support 167 that moves with the button 122. The spring 150 is thus compressed and desires to move the push button 122, the computer memory 130, and the USB electrical connector 120 in the direction indicated by arrow 127, back into the configuration shown in FIG. 25. In FIG. 11, the hook 138 is latched to protrusion 162, which prevents the USB electrical connector 120 from being retracted into the housing 112 by the spring 150. FIG. 9 shows the contact between the hook 138 and protrusion 162 in more detail.

Figure 12:
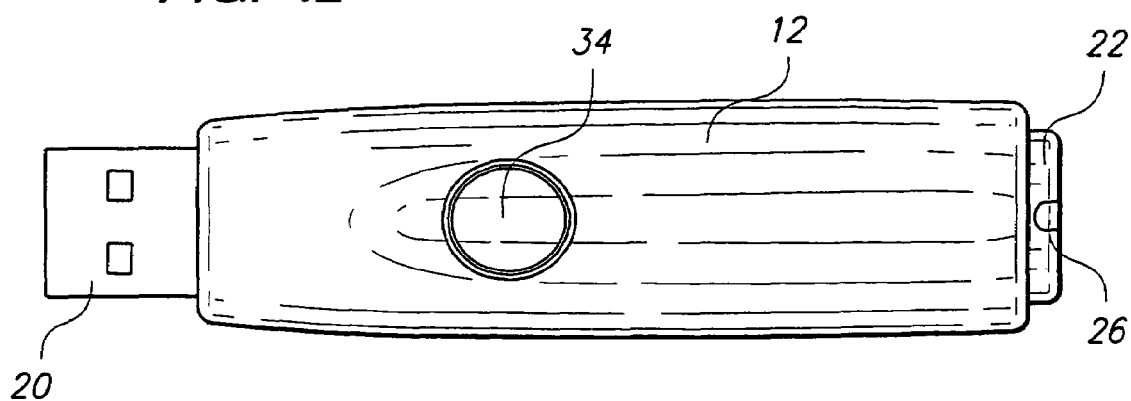
FIG. 12 shows a view of the housing with the data connector in an extended position.

FIG. 12 shows an image of the housing 12 and the push button 22 pressed in to extend the USB electrical connector 20. When extending the USB electrical connector 20, the user will grasp the housing 12 and then using their thumb or index finger, press on the button 22. This will slide the entire unit 35 and extend the USB electrical connector 20 while at the same time or substantially simultaneously causing the spring 50 inside the housing to be moved into a condition where the spring 50 is exerting force to return the USB electrical connector 20 back into the housing 12. However, the hook 38 will engage a surface that will prevent the force of spring 50 from retracting the USB electrical connector 20.

Figure 13:
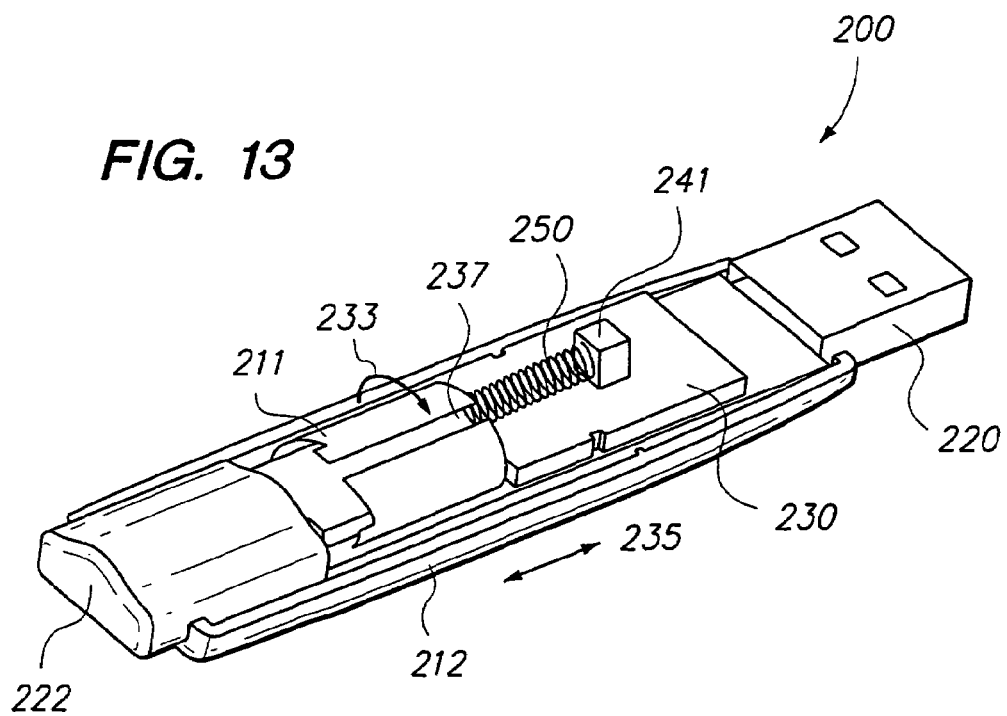
FIG. 13 shows the internal components for another embodiment of the present invention, where the user only presses on the push button to extend and retract the data connector.

Referring now to FIG. 13, it should be understood that the present invention may be designed to use a design similar to those used for a click pen. The device 200 may use a cam 211 that will allow the button 222 when depressed to move a the cam 211 so that. The cam 211 will be shaped to allow the button 222 to lock and extend USB connector 220 when the button is pressed. The cam 211 is shaped to allow the button 222 to be pressed again and allow the USB electrical connector 222 to be retracted into the housing 212. As seen in FIG. 13, the cam 211 will rotate and slide as indicated by arrows 233 and 235. The cam 211 rotates as indicated by arrow 233 when the cam follower on housing 212 (not shown) is on the top portion. The cam 211 slides when follower is in the groove 237. These motions are similar to that found in a click pen. In this embodiment, the USB electrical connector 220 remains extended until the button 222 is pressed again. The spring 250 provides the return force to urge the USB electrical connector 220 back into the housing 212. One end of the spring 250 is affixed to the housing, such as but not limited to connection to protrusion 241.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, may be used with connectors using other protocols besides USB such as but not limited IEEE 1394 Firewire connections. USB includes all current and future implementations of the protocol including USB 1.0 and 2.0. For any of the embodiments above, the connections are not limited to electrical connections. It should be understood that other connections but on optical or other techniques are also covered. By way of example and not limitation, the connector could be a TOS-link connector. In some embodiments of the present invention, once a button is pressed, the data connector may be automatically drawn back into the housing without assistance from the user. Again, variations can be made without departing from the spirit of the invention. Some embodiment of the present invention may allow for the simultaneous extension of the USB connector while loading a return spring to provide return force. Any of the above embodiments may be designed to include lanyard attachment locations. In some embodiments, these may be located on the button 22 and/or on the side portion of the housing.

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either both of those included limits are also included in the invention.

Expected variations or differences in the results are contemplated in accordance with the objects and practices of the present invention. It is intended, therefore, that the invention be defined by the scope of the claims which follow and that such claims be interpreted as broadly as is reasonable.

What is claimed is:

1. A portable memory device comprising:
   a housing having a proximal end defining a first opening end a distal end defining a second opening;
   a computer memory;
   a USB electrical connector;
   a push button extending away from the proximal end of the housing through the first opening;
   wherein said computer memory, USB electrical connector, and push button form part of a slidable unit defined by said USB electrical connector mounted on one end and said push button mounted on an opposing end;
   a release button on the housing;
   a spring mechanism for retracting said USB connector into the housing when the release button is pressed;
   said slidable unit movable between a first position where the USB connector is contained in the housing and a second position where the USB connector is extended away from the housing, wherein the movement of the slidable unit to the second position cocks the spring mechanism and latches the unit to the release button.

2. The device of claim 1 wherein the spring mechanism is placed in a compressed condition when the push button is pressed and the slidable unit is moved to the second position.

3. The device of claim 1 wherein the spring mechanism is simultaneously placed in a compressed condition when the push button is pressed and the slidable unit is moved to the second position.

4. The device of claim 1 wherein the memory device, push button, and the USB electrical connector form an integral unit.

5. The device of claim 1 wherein a visual indicator is located in the push button.

6. The device of claim 1 wherein the release button is located on an upper portion of the housing.

7. The device of claim 1 wherein the housing comprises a two-piece housing including an upper housing section and a lower housing section that combine to define the first opening and the second opening, the housing characterized by an absence of a side opening.

8. The device of claim 1 wherein the push button extends away from the proximal end of the housing through the first opening when the slidable unit is in the second position and the USB connector extends away from the distal end of the housing through the second opening.

9. The device of claim 5 wherein the push button comprises a button end and opposing sides and opposing top and bottom surfaces extending from the button end, and further wherein the visual indicator comprises a lighted visual indicator disposed along a portion of the button end.

10. The device of claim 1 wherein the push button comprises a cam configured to rotate about a longitudinal axis of the housing and configured to translate relative to the longitudinal axis when the push button is pressed to move the slidable unit.

11. A portable memory device comprising:
    a housing having a proximal opening and a distal opening;
    a slidable unit slidably mounted at least partially in the housing, wherein the slidable unit comprises a memory device slidably mounted in said housing, said memory device having a data connector mounted on one end and a push button the other end;
    a resilient member coupled to the slidable unit;
    wherein movement of the slidable unit from a first position to a second position will simultaneously extend the data connector from the housing while also loading the resilient member to urge the data connector back into the housing;

a latch coupled to the housing for holding the slidable unit in the second position; and a release button separate from said push button, said release button projecting through an upper portion of the housing.

12. The device of claim 11 wherein the data connector is a USB electrical connector.

13. The device of claim 11 wherein said release button when pressed will disengage the latch and allow the connector to be drawn into the housing.

14. The device of claim 11 wherein the memory device, push button, and the USB electrical connector form an integral unit.

15. The device of claim 11 wherein a visual indicator is located in the push button.

16. The device of claim 11 wherein the slidable unit includes a bracket having a hook mounted at the end of a cantilevered portion, wherein the hook will engage a protrusion on the housing to hold the slidable unit in the second position, against the force of the resilient member.

* * * * *